United States Patent
Chun et al.

(10) Patent No.: US 10,995,214 B2
(45) Date of Patent: May 4, 2021

(54) POLYCARBONATE RESIN COMPOSITION AND OPTICAL MOLDED ARTICLE USING THE SAME

(71) Applicant: LG CHEM, LTD., Seoul (KR)

(72) Inventors: Byoungkue Chun, Daejeon (KR); Un Ko, Daejeon (KR); Young Wook Son, Daejeon (KR); Moo Ho Hong, Daejeon (KR); Hyong Min Bahn, Daejeon (KR); Tae Yun Ko, Daejeon (KR)

(73) Assignee: LG CHEM, LTD., Seoul (KR)

( * ) Notice: Subject to any disclaimer, the term of this patent is extended or adjusted under 35 U.S.C. 154(b) by 378 days.

(21) Appl. No.: 16/305,368

(22) PCT Filed: Oct. 18, 2017

(86) PCT No.: PCT/KR2017/011539
§ 371 (c)(1),
(2) Date: Nov. 28, 2018

(87) PCT Pub. No.: WO2018/080097
PCT Pub. Date: May 3, 2018

(65) Prior Publication Data
US 2020/0317912 A1 Oct. 8, 2020

(30) Foreign Application Priority Data

Oct. 31, 2016 (KR) .................. 10-2016-0142889
Oct. 17, 2017 (KR) .................. 10-2017-0134732

(51) Int. Cl.
| | | |
|---|---|---|
| *C08L 69/00* | (2006.01) |
| *C08L 33/06* | (2006.01) |
| *C08K 5/5373* | (2006.01) |
| *C08K 5/357* | (2006.01) |
| *C08K 5/10* | (2006.01) |
| *G02B 1/04* | (2006.01) |

(52) U.S. Cl.
CPC ............... *C08L 69/00* (2013.01); *C08K 5/10* (2013.01); *C08K 5/357* (2013.01); *C08K 5/5373* (2013.01); *C08L 33/068* (2013.01); *G02B 1/041* (2013.01); *C08L 2201/10* (2013.01); *C08L 2203/20* (2013.01)

(58) Field of Classification Search
CPC .... C08L 69/00; C08L 33/068; C08L 2203/20; C08K 5/5373; C08K 5/10; C08K 5/357
See application file for complete search history.

(56) References Cited

U.S. PATENT DOCUMENTS

| | | | |
|---|---|---|---|
| 6,011,149 A | 1/2000 | Francotte | |
| 6,899,939 B2* | 5/2005 | Haese | C08K 5/103 428/64.7 |
| 2005/0009967 A1* | 1/2005 | Zahalka | C07F 9/65742 524/116 |
| 2009/0036593 A1 | 2/2009 | DeRudder et al. | |
| 2009/0093583 A1 | 4/2009 | Kawato et al. | |
| 2010/0121018 A1 | 5/2010 | Yoshida et al. | |
| 2010/0216914 A1 | 8/2010 | Oda et al. | |
| 2012/0095141 A1 | 4/2012 | Tanabe et al. | |
| 2014/0014884 A1 | 1/2014 | Hayashida | |
| 2014/0107262 A1 | 4/2014 | Shinomiya et al. | |
| 2014/0117393 A1 | 5/2014 | van Heerbeek et al. | |
| 2014/0146569 A1 | 5/2014 | Miyake et al. | |
| 2015/0045483 A1 | 2/2015 | Ueda et al. | |
| 2015/0070933 A1 | 3/2015 | van den Bogerd et al. | |
| 2016/0326365 A1 | 11/2016 | Sakaki et al. | |
| 2020/0317912 A1* | 10/2020 | Chun | C08K 5/5373 |

FOREIGN PATENT DOCUMENTS

| | | |
|---|---|---|
| CN | 101472994 A | 7/2009 |
| CN | 101679623 A | 3/2010 |
| CN | 102449066 A | 5/2012 |
| CN | 103314055 A | 9/2013 |
| EP | 2436731 A1 | 4/2012 |
| JP | 2008-045131 A | 2/2008 |
| JP | 4938212 B2 | 5/2012 |
| JP | 2013-234233 A | 11/2013 |
| KR | 10-1997-0000095 B1 | 1/1997 |
| KR | 10-2008-0061813 A | 7/2008 |
| KR | 2008-0061813 * | 7/2008 |
| KR | 10-2010-0023870 A | 3/2010 |
| KR | 10-2010-0068475 A | 6/2010 |
| KR | 10-1331358 B1 | 11/2013 |
| KR | 10-2014-0040084 A | 4/2014 |
| KR | 2014-0040084 * | 4/2014 |
| KR | 10-2014-0117570 A | 10/2014 |
| KR | 10-1511345 B1 | 4/2015 |
| KR | 10-2015-0079783 A | 7/2015 |
| KR | 10-2016-0013954 A | 2/2016 |
| TW | 201300454 A | 1/2013 |
| TW | 201307475 A | 2/2013 |
| TW | 201529717 A | 8/2015 |

* cited by examiner

Primary Examiner — Robert D Harlan
(74) Attorney, Agent, or Firm — Dentons US LLP

(57) ABSTRACT

The present invention relates to a polycarbonate resin composition and an optical molded article comprising the same. The polycarbonate resin composition according to the present invention is excellent in transmittance and color stability and thus can ensure high transparency, and further can enhance the stability of a polycarbonate resin.

19 Claims, No Drawings

POLYCARBONATE RESIN COMPOSITION AND OPTICAL MOLDED ARTICLE USING THE SAME

This application is a National Stage Application of International Application No. PCT/KR2017/011539 filed Oct. 18, 2017, and claims the benefit of Korean Patent Application No. 10-2016-0142889 filed Oct. 31, 2016 and Korean Patent Application No. 10-2017-0134732 filed Oct. 17, 2017, all of which are hereby incorporated by reference in their entirety for all purposes as if fully set forth herein.

TECHNICAL FIELD

The present invention relates to a polycarbonate resin composition capable of having excellent transmittance and color stability and thus ensuring high transparency, and also enhancing the stability of a polycarbonate resin, and an optical molded article comprising the same.

BACKGROUND ART

Recently, as liquid crystal display devices have become thinner and larger, the thickness of parts used for them is becoming thinner and thinner. A liquid crystal display ("LCD") is equipped with a backlight, which is a light emitting part that emits light from the back of LCD, and a light guide plate or a diffusion plate for diffusing or transmitting light is used depending on the type and position of light source. The thickness of the light guide plate also becomes thinner and thinner in accordance with the recent trend, and the general level of the light guide plate actually used is around 0.5 mm in thickness, but the thinnest is up to about 0.3 mm, and the thickness tends to become thinner in future.

In accordance with the thinning trends, the use of edge type backlight unit in which LEDs are mounted to the corner of the backlight is increasing, instead of cold cathode fluorescent lamps (CCFLs) which have been mainly used in the past. In the edge type backlight unit, light emitted from a light source mounted to the corner is transmitted through the light guide plate, and part of the light transmitted through the plate is scattered by a light scattering layer applied to the surface of the plate, whereby the liquid crystal display device is illuminated by the surface light source that uniformly emits light on the entire surface. The light scattering layer is formed by transferring or printing a dot pattern on the surface of the light guide plate. Recently, a fine prism structure is also transferred to increase the light efficiency.

Since the light guide plate requires high light transmittance, PMMA, which is an acrylic resin, is generally used as a material of the light guide plate. Although acrylic resins have high light transmittance, they are insufficient in mechanical strength and thus are not suitable for application to a thin light guide plate, and also they have insufficient heat resistance and thus are vulnerable to heat generated in electronic equipment, which are disadvantageous.

Polycarbonate has attracted attention instead of such an acrylic resin. Polycarbonate is superior in mechanical strength as compared with acrylic resin and thus can be used as a material for a thin light guide plate. In addition, since polycarbonate is excellent in heat resistance and flame retardancy, it is gradually replacing the acrylic resin in LED backlight unit and lighting apparatus with a large amount of heat generation. However, since polycarbonate has a lower total light transmittance than an acrylic resin, it is required that polycarbonate has a light transmittance corresponding to that of an acrylic resin while maintaining the advantages of polycarbonate.

In this connection, Japanese Patent Laid-Open Publication No. 2008-045131 discloses that PMMA having a viscosity average molecular weight (Mv) of 20,000 to 60,000 among an acrylic resin is blended in a range of 0.1 to 0.3 phr with a polycarbonate having an Mv of 15,000 to 40,000 to exhibit excellent photoconductivity. However, it is still necessary to improve physical properties such as heat resistance.

DISCLOSURE

Technical Problem

It is one object of the present invention to provide a polycarbonate resin composition capable of having excellent transmittance and color stability and thus ensuring high transparency, and also enhancing the stability of a polycarbonate resin.

It is another object of the present invention to provide an optical molded article comprising the above-mentioned resin composition.

Technical Solution

In order to achieve these objects, the present invention provides a polycarbonate resin composition comprising: a polycarbonate; a cyclic phosphite ester compound; a linear phosphite ester compound; a vinyl-based polymer including a (meth)acrylate repeating unit containing an epoxy functional group; and a photoreactive compound containing a phenylene functional group, wherein the linear phosphite ester compound is contained in an amount of 40 to 90 parts by weight relative to 100 parts by weight of the cyclic phosphite ester compound.

The present invention can also provide an optical molded article comprising the above-mentioned polycarbonate resin composition.

The polycarbonate resin composition according to a specific embodiment of the present invention and a molded article thereof will be described in more detail below.

The terminology used herein is for the purpose of illustrating particular embodiments only and is not intended to be limiting of the invention. As used herein, the singular forms "a," "an" and "the" are intended to include the plural forms as well, unless the context clearly indicates otherwise. It will be understood that the terms "comprises," "comprising," "includes" and/or "including" as used herein specify the presence of stated features, steps, components or a combination thereof, but do not preclude the presence or addition of one or more other features, components, or a combination thereof.

Since a variety of modifications may be made to the present invention and there are various embodiments of the present invention, specific embodiments thereof will now be illustrated and will be described in detail. It should be understood, however, that there is no intent to limit the invention to any particular forms disclosed, but the invention is to cover all modifications, equivalents, and alternatives falling within the spirit and scope of the present invention.

Cyclic Phosphite Ester Compound

The polycarbonate resin composition of one embodiment may include a cyclic phosphite ester compound. As the polycarbonate resin composition includes the cyclic phosphite ester compound described above, the antioxidant power of the polycarbonate resin composition can be enhanced, and the color stability of the initial product can be secured, thereby realizing the transparency of the polycarbonate resin composition.

The phosphite ester compound is a compound in which an organic functional group is bonded to an oxygen atom contained in a phosphite functional group and is characterized by having a cyclic structure. The cyclic structure may be formed through a chemical bond between three or more atoms including phosphorus (P) atoms and oxygen (O) atoms contained in a phosphite functional group in the phosphite ester compound, and the number of rings is not limited.

Specifically, the cyclic phosphite ester compound may include two phosphite groups and a tetravalent organic functional group bonded to the two phosphite groups. Two oxygen atoms in the three oxygen atoms contained in the phosphite functional group are bonded to two reactive sites contained in the tetravalent organic functional group, respectively, and two oxygen atoms in the three oxygen atoms contained in another phosphite functional group may be bonded to the remaining two reactive sites contained in the tetravalent organic functional group, respectively.

The tetravalent organic functional group may include four reactive sites (or radicals) capable of forming a bond with an oxygen atom contained in a phosphite functional group, as described above, whereby one organic functional groups can form a bond with up to four atoms at the same time.

More specifically, the cyclic phosphite ester compound may be represented by the following chemical formula 1.

[Chemical Formula 1]

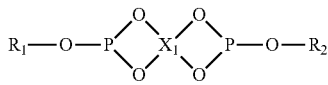

in the chemical formula 1, $X_1$ is a tetravalent organic functional group, and $R_1$ and $R_2$ are the same or different from each other and are each independently an aryl group having 6 to 40 carbon atoms.

The $X_1$ is the above-mentioned tetravalent organic functional group, and specific examples thereof are not particularly limited, but preferably, it can be represented by the following chemical formula 1-1.

[Chemical Formula 1-1]

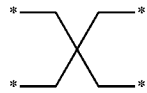

in the chemical formula 1-1, "*" is a point of a bonding position (or a reactive site).

On the other hand, the aryl group having 6 to 40 carbon atoms is a monovalent functional group derived from an arene, and may be, for example, monocyclic or polycyclic. Specifically, the monocyclic aryl group may be a phenyl group, a biphenyl group, a terphenyl group, a stilbenyl group, and the like, but is not limited thereto. The polycyclic aryl group may be a naphthyl group, an anthryl group, a phenanthryl group, a pyrenyl group, a perylenyl group, a chrycenyl group, a fluorenyl group, and the like, but is not limited thereto. At least one hydrogen atom in these aryl groups may be substituted with another substituent. Examples of the substituent include an alkyl group having 1 to 10 carbon atoms, an alkenyl group having 2 to 10 carbon atoms, an alkynyl group having 2 to 10 carbon atoms, an aryl group having 6 to 12 carbon atoms, a heteroaryl group having 2 to 12 carbon atoms, an arylalkyl group having 6 to 12 carbon atoms, a halogen atom, a cyano group, an amino group, an amidino group, a nitro group, an amide group, a carbonyl group, a hydroxy group, a sulfonyl group, a carbamate group, an alkoxy group having 1 to 10 carbon atoms, and the like.

More preferably, the aryl group having 6 to 40 carbon atoms may include 2,6-di-tert-butyl-4-methylphenyl group. A specific example of the compound represented by the chemical formula 1 is bis(2,6-di-tert-butyl-4-methylphenyl) pentaerythritol-diphosphite [PEP36].

Linear Phosphite Ester Compound

The polycarbonate resin composition of one embodiment may include a linear phosphite ester compound. As the polycarbonate resin composition includes the above-described linear phosphite ester compound, not only the antioxidant power of the polycarbonate resin composition is enhanced, but also the stability of the polycarbonate resin can be enhanced.

Particularly, the linear phosphite ester compound does not undergo side reactions during moisture addition, and thus can suppress the decomposition of the polycarbonate resin due to by-products such as acidic substances. In addition, the linear phosphite ester compound can suppress the phenomenon of white turbidity in the process of producing an optical molded article, thereby increasing the transparency of the polycarbonate resin composition and the molded article using the same.

Therefore, when the linear phosphite ester compound is mixed and used in a specific ratio together with the cyclic phosphite ester compound, it is possible to realize remarkable effects of maintaining the antioxidant power of the polycarbonate resin composition at a certain level or more and maintaining the color within a proper range, thus ensuring transparency, and minimizing decomposition of the polycarbonate resin, and further minimizing the phenomenon of white turbidity of the polycarbonate resin composition.

A phosphite ester compound is a compound in which an organic functional group is bonded to an oxygen atom contained in a phosphite functional group, and is characterized by having a linear structure. The linear structure is a concept opposite to the cyclic structure, and it can form a straight line rather than a ring via a chemical bond between three or more atoms including a phosphorus (P) atom and an oxygen (O) atom contained in a phosphite functional group in the phosphite ester compound.

Specifically, the linear phosphite ester compound may include a phosphite functional group and an aryl group having 6 to 40 carbon atoms bonded to the phosphite functional group. The aryl groups having 6 to 40 carbon atoms may be bonded to each of the three oxygen atoms contained in the phosphite functional group.

The aryl group having 6 to 40 carbon atoms is a monovalent functional group derived from an arene, and may be, for example, monocyclic or polycyclic. Specifically, the monocyclic aryl group may be a phenyl group, a biphenyl group, a terphenyl group, a stilbenyl group, and the like, but is not limited thereto. The polycyclic aryl group may be a naphthyl group, an anthryl group, a phenanthryl group, a pyrenyl group, a perylenyl group, a chrycenyl group, a fluorenyl group, and the like, but is not limited thereto. At least one hydrogen atom in these aryl groups may be substituted with another substituent. Examples of the substituent include an alkyl group having 1 to 10 carbon atoms, an alkenyl group having 2 to 10 carbon atoms, an alkynyl group having 2 to 10 carbon atoms, an aryl group having 6 to 12 carbon atoms, a heteroaryl group having 2 to 12 carbon atoms, an arylalkyl group having 6 to 12 carbon atoms, a halogen atom, a cyano group, an amino group, an amidino group, a nitro group, an amide group, a carbonyl group, a hydroxy group, a sulfonyl group, a carbamate group, an alkoxy group having 1 to 10 carbon atoms, and the like.

More preferably, the linear phosphite ester compound may be represented by the chemical formula 2.

[Chemical Formula 2]

in the chemical formula 2, $R_3$, $R_4$ and $R_5$ are the same or different from each other and are each independently an aryl group having 6 to 40 carbon atoms.

More preferably, the aryl group having 6 to 40 carbon atoms may be 2,4-di-di-tert-butylphenyl group. Specific examples of the compound represented by the chemical formula 2 include tris(2,4-di-t-butylphenyl)phosphite [P-168].

Epoxy Group-Containing Vinyl-Based Polymer

On the other hand, the polycarbonate is relatively excellent in mechanical properties, electrical properties, and weather resistance as compared with other types of resins, but since the transparency of long-wavelength light and color stability as an optical molded article is low, it is necessary to improve these properties. Thus, a vinyl-based polymer including a (meth)acrylate repeating unit containing an epoxy functional group is used together with the polycarbonate.

The term "(meth)acryl) as used herein means acryl and methacryl. That is, the (meth)acrylate should be understood as meaning acrylate or methacrylate.

Further, the vinyl-based polymer including a (meth)acrylate repeating unit containing an epoxy functional group has preferably a weight average molecular weight of 1,000 g/mol to 10,000 g/mol. Within this range, the physical properties of the polycarbonate composition can be effectively improved. The weight average molecular weight refers to the weight average molecular weight in terms of polystyrene measured by GPC method. In the process of measuring the weight average molecular weight in terms of polystyrene measured by the GPC method, a detector such as a commonly known analyzer and a differential refractive index detector, and an analytical column can be used. Commonly applied conditions, solvents and flow rates can be used. As a specific example of the measurement conditions, a temperature of 30° C., a chloroform solvent and a flow rate of 1 mL/min can be mentioned.

Specifically, the epoxy-containing vinyl-based polymer may include a (meth)acrylate repeating unit containing an epoxy functional group, and in the (meth)acrylate repeating unit containing the epoxy functional group, the epoxy functional group can be bonded to the terminal of the branched chain of the (meth)acrylate repeating unit. The (meth)acrylate repeating unit may contain a main chain formed through polymerization between vinyl-based functional groups, and a branched chain extending in a branch shape from the main chain. The epoxy functional group may form a bond at the terminal of the branched chain of the (meth)acrylate repeating unit.

More specifically, the (meth)acrylate repeating unit containing the epoxy functional group may include a repeating unit represented by the following chemical formula 3:

[Chemical Formula 3]

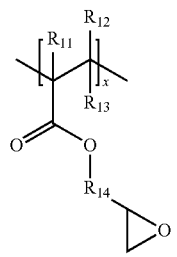

In the chemical formula 3, $R_{11}$, $R_{12}$ and $R_{13}$ are hydrogen or a linear or branched alkyl group having 1 to 10 carbon atoms, $R_{14}$ is a linear or branched alkylene group having 1 to 10 carbon atoms, and x is an integer of 1 to 20.

The alkyl group is a monovalent functional group derived from an alkane, and may be, for example, linear, branched or cyclic, and examples thereof include methyl, ethyl, propyl, isobutyl, sec-butyl, tert-butyl, pentyl, hexyl and the like. The alkylene group is a divalent functional group derived from an alkane, and may be, for example, linear, branched or cyclic, and examples thereof include a methylene group, an ethylene group, a propylene group, an isobutylene group, a sec-butylene group, a tert-butylene group, a pentylene group, a hexylene group and the like.

The alkyl group or alkylene group may be substituted or unsubstituted, and the term "substituted" means that a hydrogen atom contained in an alkyl group or an alkylene group is replaced with a specific functional group. Examples of the substituted functional groups are not particularly limited, and various functional groups or atomic groups widely known in the art, such as halogen, hydroxy group, amino group and the like can be used without limitation.

Further, the epoxy group-containing vinyl-based polymer may have an epoxy equivalent weight of 100 g/mol to 500 g/mol, or 200 g/mol to 400 g/mol. As the epoxy group-containing vinyl-based polymer contains a specific amount of epoxy functional groups as described above, excellent transparency of long-wavelength light and color stability can be maintained.

The epoxy group-containing vinyl-based polymer may further include an aromatic vinyl-based repeating unit or a (meth)acrylic-based repeating unit. The aromatic vinyl-based repeating unit means a repeating unit derived from an aromatic vinyl-based monomer, and specifically means a repeating unit constituting a polymer formed through polymerization between aromatic vinyl-based monomers. That is, the epoxy group-containing vinyl polymer may include, for example, a copolymer containing at least one repeating unit selected from the group consisting of a (meth)acrylate repeating unit containing an epoxy functional group; an aromatic vinyl-based repeating unit; and a (meth)acrylic-based repeating unit.

The aromatic vinyl monomer is a compound having one vinylic double bond and at least one benzene nucleus in the same molecule, and specific examples of the aromatic vinyl monomer are not particularly limited, but for example, compounds such as styrene, alpha-methylstyrene, 2-methylstyrene, 3-methylstyrene, 4-methylstyrene, 4-ethylstyrene, t-butylstyrene, 2,5-dimethylstyrene, 1,3-dimethylstyrene, 2,4-dimethylstyrene, 4-methoxystyrene, 4-ethoxystyrene, 4-propoxystyrene, 4-butoxystyrene, chlorostyrene, dichlorostyrene, trichlorostyrene, vinyltoluene, bromostyrene, dibromostyrene, tribromostyrene, vinylnaphthalene, isopropenyl naphthalene, isopropenyl biphenyl, divinyl benzene, alpha-methyl styrene vinyl toluene and the like can be mentioned.

More specifically, it may include the aromatic vinyl-based repeating unit represented by the following chemical formula 4:

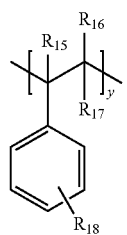

[Chemical Formula 4]

in the chemical formula 4, $R_{15}$ to $R_{18}$ are each independently hydrogen or a linear or branched alkyl group having 1 to 10 carbon atoms, and y is an integer of 1 to 20. The Rig functional group may be bonded to at least one of the remaining 2nd to 6th carbon atoms excluding the 1st carbon atom to which the vinyl-based functional group is bonded in the benzene ring.

The alkyl group is a monovalent functional group derived from an alkane, and may be, for example, linear, branched or cyclic, and examples thereof include methyl, ethyl, propyl, isobutyl, sec-butyl, tert-butyl, pentyl, hexyl and the like.

The alkyl group may be substituted or unsubstituted, and the term "substituted" means that a hydrogen atom contained in an alkyl group is substituted with a specific functional group. Examples of the substituted functional groups are not particularly limited, and various functional groups or atomic groups widely known in the art, such as halogen, hydroxy group, amino group and the like can be used without limitation.

The (meth)acrylic-based repeating unit means a repeating unit derived from a (meth)acrylic monomer, and specifically refers to a repeating unit constituting a polymer formed through polymerization between (meth)acrylic monomers. The (meth)acrylic monomer refers to a compound containing a (meth)acrylic functional group. The specific examples thereof are not particularly limited, but include, for example, a (meth)acrylate compound or a (meth)acrylic acid compound.

More specifically, the (meth)acrylic-based repeating unit may include a repeating unit represented by the following chemical formula 5:

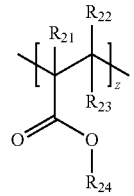

[Chemical Formula 5]

in the chemical formula 5, $R_{21}$ to $R_{24}$ are each independently hydrogen or a linear or branched alkyl group having 1 to 10 carbon atoms, and z is an integer of 1 to 20.

The alkyl group is a monovalent functional group derived from an alkane, and may be, for example, linear, branched or cyclic, and examples thereof include methyl, ethyl, propyl, isobutyl, sec-butyl, tert-butyl, pentyl, hexyl and the like.

The alkyl group may be substituted or unsubstituted, and the term "substituted" means that a hydrogen atom contained in an alkyl group is replaced with a specific functional group. Examples of the substituted functional groups are not particularly limited, and various functional groups or atomic groups widely known in the art, such as halogen, hydroxy group, amino group and the like can be used without limitation.

More specifically, the vinyl-based polymer including a (meth)acrylate repeating unit containing an epoxy functional group may include the repeating units of the chemical formula 3, the chemical formula 4, and the chemical formula 5, and the descriptions of the chemical formula 3, the chemical formula 4, and the chemical formula 5 include the aforementioned descriptions. More specific examples of the vinyl-based polymer including a (meth)acrylate repeating unit containing an epoxy functional group include Joncryl ADR-4370F (epoxy equivalent weight: 285 g/mol), ADR-4468 or the like, having a weight average molecular weight of 6,800 g/mol, available from BASF In the present invention, by using Joncryl ADR-4370F or ADR-4468, which has not been well known in the prior art, the hydrolysis resistance property and transparency of the polycarbonate resin composition can be improved by chain extension of other components in the polycarbonate repeating unit. In particular, unlike Joncryl ADR-4368, which is manufactured in high purity and restrictively used for food products, there is an advantage that it can be applied to mass production.

Photoreactive Compound Containing Phenylene Functional Group

The polycarbonate resin composition of one embodiment may include a photoreactive compound containing a phenylene functional group. The photoreactive compound containing the phenylene functional group is contained in the polycarbonate resin composition and absorbs light in an ultraviolet (UV) wavelength band, thereby preventing the polycarbonate resin composition from being deformed by ultraviolet rays.

In particular, it has been confirmed through the examples of the present invention and comparative examples that the photoreactive compound containing a phenylene group can maintain excellent transparency of long-wavelength light and color stability as compared with a substance that absorbs light in other ultraviolet wavelength band.

Specifically, the photoreactive compound containing a phenylene functional group may include an aromatic compound having 6 to 20 carbon atoms or an ester compound having 4 to 20 carbon atoms bonded to the phenylene functional group, together with the phenylene functional group.

That is, an aromatic compound having 6 to 20 carbon atoms or an ester compound having 4 to 20 carbon atoms may be bonded to one terminal or both terminals of the phenylene functional group, and more preferably the aromatic compound having 6 to 20 carbon atoms may be bonded to both terminals of the phenylene functional group or the ester compound having 4 to 20 carbon atoms may be bonded to both terminals of the phenylene functional group.

In this case, a photoreactive compound in which an aromatic compound having 6 to 20 carbon atoms is bonded to both terminals of the phenylene functional group and a photoreactive compound in which an ester compound having 4 to 20 carbon atoms is bonded to both terminals of the phenylene group can form a conjugate structure and thus exhibit reactivity to ultraviolet rays.

More specifically, the aromatic compound having 6 to 20 carbon atoms can include benzoxazinone. The phenylene functional group may be bonded to the $2^{nd}$ carbon atom of the benzoxazinone compound. As described above, a specific example in which benzoxazinone is bonded to both terminals of the phenylene group include 2,2'-(1,4-phenylene)bis(4H-3,1-benzoxazine-4-one) [UV3638].

In addition, the ester compound having 4 to 20 carbon atoms may include a methylene malonic acid ester. The phenylene functional group can be bonded to the terminal carbon of methylene contained in the methylene malonic acid ester. As described above, a specific example in which the methylene malonic acid ester is bonded to both terminals of the phenylene group includes p-phenylene bis(methylene malonic acid)tetraethyl ester [Hostavin B-Cap].

Polycarbonate

The term "polycarbonate" as used herein means a polymer produced by reacting a diphenolic compound, a phosgene, a carbonic acid ester, or a combination thereof. Polycarbonate is extremely excellent in heat resistance, impact resistance, mechanical strength, transparency and the like, and thus is widely used in the production of compact discs, transparent sheets, packaging materials, automobile bumpers, ultraviolet blocking films and the like.

Examples of the diphenolic compound include hydroquinone, resorcinol, 4,4'-dihydroxydiphenyl, 2,2-bis(4-hydroxyphenyl)propane (also referred to as 'bisphenol A'), 2,4-bis(4-hydroxyphenyl)-2-methylbutane, bis(4-hydroxyphenyl)methane, 1,1-bis(4-hydroxyphenyl)cyclohexane, 2,2-bis(3-chloro-4-hydroxyphenyl)propane, 2,2-bis(3,5-dimethyl-4-hydroxyphenyl)propane, 2,2-bis(3,5-dichloro-4-hydroxyphenyl)propane, 2,2-bis(3,5-dibromo-4-hydroxyphenyl)propane, bis(4-hydroxyphenyl)sulfoxide, bis(4-hydroxyphenyl)ketone, bis(4-hydroxyphenyl)ether and the like. Preferably, 4,4'-dihydroxydiphenyl and 2,2-bis(4-hydroxyphenyl)propane can be used. In this case, the structure of the polycarbonate is represented by the following chemical formula 6:

[Chemical Formula 6]

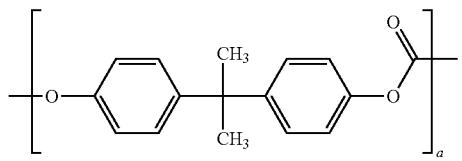

in the chemical formula 6, a is an integer of 1 or more.

The polycarbonate may be a mixture of copolymers prepared from two or more diphenols. In addition, as the polycarbonate, a linear polycarbonate, a branched polycarbonate, a polyester carbonate copolymer resin and the like can be used.

Examples of the linear polycarbonate may include polycarbonates prepared from bisphenol-A. The branched polycarbonates may be those prepared by reacting a polyfunctional aromatic compound such as trimellitic anhydride and trimellitic acid with a diphenol and a carbonate. The polyfunctional aromatic compound may be contained in an amount of 0.05 to 2 mol % based on the total amount of the branched polycarbonate. Examples of the polyester carbonate copolymer resin may include those prepared by reacting a bifunctional carboxylic acid with a diphenol and a carbonate. As the carbonate, diaryl carbonate such as diphenyl carbonate, ethylene carbonate and the like may be used.

Preferably, the polycarbonate has a weight average molecular weight of 14,000 to 30,000 g/mol. During the production of thin film products within the above range, the moldability and workability are excellent.

Polycarbonate Resin Composition

The polycarbonate resin composition according to the present invention comprises 100 parts by weight of a polycarbonate; 0.001(10 ppm) to 1(1%) parts by weight of a cyclic phosphite ester compound; 0.001(10 ppm) to 1(1%) parts by weight of a linear phosphite ester compound; 0.001(10 ppm) to 1(1%) parts by weight of a vinyl-based polymer including a (meth)acrylate repeating unit containing an epoxy functional group; and 0.001(10 ppm) to 1(1%) parts by weight of a photoreactive compound containing a phenylene functional group.

In particular, the linear phosphite ester compound is contained in an amount of 40 to 90 parts by weight, or 50 parts by weight to 80 parts by weight, or 60 parts by weight to 70 parts by weight relative to 100 parts by weight of the cyclic phosphite ester compound. Conventionally, either a cyclic phosphite ester compound or a linear phosphite ester compound has been added in order to improve the physical properties of the polycarbonate resin composition. However, as the polycarbonate resin composition of one embodiment as described above contains the cyclic phosphite ester and the linear phosphite ester compound in a specific ratio, the phenomenon of white turbidity can be minimized under conditions of high temperature, high pressure, and high humidity, and thus the transparency can be stably realized, and further the color stability can be realized.

If the content of the linear phosphite ester compound relative to 100 parts by weight of the cyclic phosphite ester compound is excessively decreased to be less than 40 parts by weight, the acidic substance is produced by hydrolysis reaction under moisture condition according to the increase in the content of the cyclic phosphite ester compound, and the decomposition of the polycarbonate resin may be progressed. Further, the transparency of the polycarbonate resin composition may decrease due to the phenomenon of white turbidity under conditions of high temperature, high pressure and high humidity, and thus it may be difficult to apply to molded products such as a light emitting diode and a lens.

If the content of the linear phosphite ester compound relative to 100 parts by weight of the cyclic phosphite ester compound is excessively increased to be higher than 90 parts by weight, the color stability of the initial product can be reduced due to the increase in the content of the linear phosphite ester compound, thereby resulting in a reduction in yellowing and transparency of the product.

In addition, the polycarbonate resin composition may further include 10 parts by weight to 300 parts by weight, or 20 parts by weight to 70 parts by weight, or 30 parts by weight to 45 parts by weight of the vinyl-based polymer including a (meth)acrylate repeating unit containing an epoxy functional group, based on 100 parts by weight of the cyclic phosphite ester compound and the linear phosphite ester compound. 100 parts by weight of the cyclic phosphite ester compound and the linear phosphite ester compound means 100 parts by weight of the sum total of the cyclic phosphite ester compound and the linear phosphite ester compound.

Moreover, the polycarbonate resin composition may further include 10 parts by weight to 300 parts by weight, or 50 parts by weight to 150 parts by weight, or 80 parts by weight to 99 parts by weight of the photoreactive compound containing a phenylene functional group based on 100 parts by weight of the cyclic phosphite ester compound and the linear phosphite ester compound. 100 parts by weight of the cyclic phosphite ester compound and the linear phosphite ester compound means 100 parts by weight of the sum total of the cyclic phosphite ester compound and the linear phosphite ester compound.

In addition, if necessary, the resin composition may further include one or more additives selected from the group consisting of an antioxidant, a heat stabilizer, a plasticizer, an antistatic agent, a nucleating agent, a flame retardant, a lubricant, an impact modifier, a fluorescent whitening agent, an ultraviolet absorber and a radiation absorber, which are commonly used in the art.

The resin composition can be preferably produced by mixing a polycarbonate, a cyclic phosphite ester compound, a linear phosphite ester compound, a vinyl-based polymer including a (meth)acrylate repeating unit containing an epoxy functional group, and a photoreactive compound containing a phenylene functional group, and, optionally, additives, and it is desirable to melt-knead and produce into pellets in order to produce an optical molded article as will be described below.

The melt kneading may be carried out by a method commonly used in the art, for example, a method using a ribbon blender, a Henschel mixer, a Banbury mixer, a drum tumbler, a single screw extruder, a twin screw extruder, a co-kneader, a multi-screw extruder and the like. The temperature of the melt-kneading can be suitably adjusted as needed, and preferably it may be adjusted to a temperature of 200 to 300° C.

Optical Molded Article

The present invention also provides an optical molded article comprising the resin composition. Preferably, the optical molded article is a light guide plate, a light emitting diode or a lens.

The term "light guide plate" as used herein means a component that performs the luminance and uniform lighting function of the backlight unit of the liquid crystal display device. Since light is transmitted through the light guide plate, the light emitting diode or the lens, transparency, that is, light transmittance, should be excellent. In addition, since a molding temperature of the light guide plate and a high temperature during operation are required, a high color stability is required.

Therefore, the resin composition according to the present invention is excellent in light transmittance and color stability, and thus can be usefully used as an optical molded article.

The molded article can be produced by a method commonly used in the art. For example, the molded article can be produced by applying a molding process such as an injection molding process, an injection compression molding process, an extrusion molding process, a vacuum molding process, a blow molding process, a press molding process, an air-pressure molding process, a foam molding process, a thermal bending molding process, a compression molding process, a calendar molding process, a rotary molding process, or the like, using the melt-kneaded product or pellet of the resin composition according to the present invention as a raw material.

The size, thickness and the like of the molded article can be appropriately adjusted according to the purpose of use, and the shape of the light guide plate can also have a flat plate shape or a curved shape depending on the purpose of use.

Advantageous Effects

The polycarbonate resin composition according to the present invention is excellent in transmittance and color stability and thus can ensure high transparency, and further can enhance the stability of a polycarbonate resin.

DETAILED DESCRIPTION OF THE EMBODIMENTS

Below, preferred embodiments will be provided in order to assist in the understanding of the present disclosure. However, these examples are provided only for illustration of the present invention, and should not be construed as limiting the present invention to these examples.

Materials Used

The following materials were used in Examples and Comparative Examples below.

Polycarbonate Resin (PC)

A bisphenol A type linear polycarbonate having a weight average molecular weight of 29,000 g/mol and MFR (300° C., 1.2 kg) of 14 g/min was used.

P-168

Tris(2,4-di-tert-butylphenyl)phosphite]; IRGAFOS 168

PEP36

Bis(2,6-di-tert-butyl-4-methylphenyl)pentaerythritol-di-phosphite]; ADK STAB

ADR-4370F

Joncryl ADR-4370F (epoxy equivalent weight: 285 g/mol) having a weight average molecular weight of 6,800 g/mol available from BASF was used.

ADR-4468

Joncryl ADR-4468 available from BASF was used. The ADR-4468 has the same Cas No. as ADR 4370F, but product with slightly increased epoxy equivalent weight and molecular weight.

C2021P (3',4'-Epoxycyclohexane)methyl 3,4-epoxycyclohexylcarboxylate

UV3638

2,2'-(1,4-phenylene)bis(4H-3,1-benzoxazin-4-one)

B-Cap p-Phenylenebis(methylenemalonic acid)tetraethyl ester]; Hostavin B-CAP

T329

2-(2H-benzotriazol-2-yl)-4-(1,1,3,3-tetramethylbutyl)phenol; Tinuvin 329

T327

2-(2'-Hydroxy-3',5'-di-tert-butylphenyl)-5-chlorobenzotriazole; Tinuvin 327

UV3030
1,3-bis[(2-cyano-3,3-diphenylacryloyl)oxy]-bis[[(2-cyano-3,3-diphenylacryloyl)oxy]methyl]propane Examples and Comparative Examples After mixing the respective additive components with the content as shown in Table 1 below based on 100 parts by weight of the polycarbonate resin composition, pellet samples were prepared at a rate of 55 kg per hour in a twin screw extruder (L/D=36, Φ=45, barrel temperature: 240° C.).

TABLE 1

Additive composition (unit: ppm) of the polycarbonate resin compositions of Examples and Comparative Examples

| Category | P-168 | PEP36 | ADR-4370F | ADR-4468 | C2021P | UV3638 | B-Cap | T329 | T327 | UV3030 |
|---|---|---|---|---|---|---|---|---|---|---|
| Example 1 | 500 | 750 | 500 | — | — | 1200 | — | — | — | — |
| Example 2 | 500 | 750 | 500 | — | — | — | 1200 | — | — | — |
| Example 3 | 500 | 750 | — | 500 | — | 1200 | — | — | — | — |
| Comparative Example 1 | — | 750 | 500 | — | — | — | — | 1200 | — | — |
| Comparative Example 2 | 750 | — | — | — | 500 | — | — | — | 1200 | — |
| Comparative Example 3 | 750 | — | 250 | — | 250 | — | — | — | — | 1200 |
| Comparative Example 4 | — | 750 | 500 | — | — | 1200 | — | — | — | — |
| Comparative Example 5 | — | 750 | 500 | — | — | — | 1200 | — | — | — |
| Comparative Example 6 | 750 | — | 500 | — | — | 1200 | — | — | — | — |
| Comparative Example 7 | 750 | — | 500 | — | — | — | 1200 | — | — | — |
| Comparative Example 8 | 750 | 500 | 500 | — | — | 1200 | — | — | — | — |
| Comparative Example 9 | 100 | 1150 | 500 | — | — | 1200 | — | — | — | — |

Experimental Example

The properties of the pellets prepared in the above Examples and Comparative Examples were measured by the following methods.

Transmittance of long-wavelength light (T %) and color of long-wavelength light (YI):

Each of the samples (width/length/thickness=150 mm/80 mm/4 mm) was injection-molded. the transmittance of long-wavelength light (T %) and the color of long-wavelength light (YI) were measured by irradiating in a perpendicular direction to a thickness of the sample using a spectrophotometer U-4100 available from Hitachi. The results are shown in Table 2 below.

Occurrence of white turbidity:

Each of the samples (width/length/thickness=30 mm/60 mm/3 mm) was injection-molded and kept in an autoclave under conditions of 120° C. and 100% RH for 168 hours, and then haze was measured according to the measurement standard of ASTM D1003 using a hazemeter (NIPPON DENSHOKU, NDH5000SP), and the results are shown in Table 2 below.

TABLE 2

Results of Experimental Examples

| Category | Color of long-wavelength light (YI) | Transmittance of long-wavelength light (T %) | Haze (%) |
|---|---|---|---|
| Example 1 | 8.12 | 80.12 | 1.76 |
| Example 2 | 8.23 | 79.87 | 1.79 |
| Example 3 | 8.02 | 81.23 | 1.75 |
| Comparative Example 1 | 10.27 | 75.93 | 99.27 |

TABLE 2-continued

Results of Experimental Examples

| Category | Color of long-wavelength light (YI) | Transmittance of long-wavelength light (T %) | Haze (%) |
|---|---|---|---|
| Comparative Example 2 | 11.03 | 75.35 | 2.07 |
| Comparative Example 3 | 11.20 | 75.55 | 2.15 |
| Comparative Example 4 | 8.48 | 78.32 | 99.15 |
| Comparative Example 5 | 8.53 | 79.40 | 99.48 |
| Comparative Example 6 | 11.88 | 76.21 | 1.98 |
| Comparative Example 7 | 12.01 | 75.64 | 2.18 |
| Comparative Example 8 | 10.58 | 76.95 | 2.11 |
| Comparative Example 9 | 11.21 | 73.28 | 85.49 |

As shown in Table 2, in the case of Examples according to the present invention, as ADR-4370F or ADR-4468 was added while adding the P-168 additive and the PEP36 additive together, and UV-3638 or B-Cap was used as an ultraviolet stabilizer, it could be confirmed that they had a low color of long-wavelength light (8.02 to 8.23) and a high transmittance of long-wavelength light (79.87 to 81.23), and the haze value of the finally produced optical molded article was as low as 1.79% or less, as compared with Comparative Examples, and thereby the white turbidity did not occur.

On the other hand, in the case of Comparative Example 1, Comparative Example 4 and Comparative Example 5, in which only one kind of PEP 36 additive was used, it was confirmed that the haze value was as high as 99% or more and thus the white turbidity occurred, and that it was not suitable for application to an optical molded article.

Further, in the case of Comparative Example 6 and Comparative Example 7, in which only one kind of P-168 additive was used, the transmittance of long-wavelength light decreased to less than 77%, and the color of long-wavelength light increased to 11 or more, thereby making it difficult to secure a color stability (transparency).

Further, even in the case of Comparative Example 2 and Comparative Example 3, in which other ultraviolet stabilizers rather than UV3638 or B-Cap were used, it could be confirmed that they exhibited a lower transmittance and a higher color of long-wavelength light, as compared with Examples.

On the other hand, Comparative Example 8 in which 150 parts by weight of P-168, which is a linear phosphite ester compound, was added relative to 100 parts by weight of PEP36 which is a cyclic phosphite ester compound, and Comparative Example 9 in which 8.7 parts by weight of P-168, which is a linear phosphite ester compound, was added relative to 100 parts by weight of PEP36 which is a cyclic phosphite ester compound, the color of long-wavelength light was increased, the transmittance of long-wavelength light was decreased and the haze value increased, as compared with Examples, which is disadvantageous for application to an optical molded article.

The invention claimed is:

1. A polycarbonate resin composition comprising:
   a polycarbonate;
   a cyclic phosphite ester compound;
   a linear phosphite ester compound;
   a vinyl-based polymer including a (meth)acrylate repeating unit containing an epoxy functional group; and
   a photoreactive compound containing a phenylene functional group,
   wherein the linear phosphite ester compound is contained in an amount of 40 to 90 parts by weight relative to 100 parts by weight of the cyclic phosphite ester compound.

2. The polycarbonate resin composition of claim 1, comprising 10 to 300 parts by weight of the vinyl-based polymer including a (meth)acrylate repeating unit containing an epoxy functional group, based on 100 parts by weight of the cyclic phosphite ester compound and the linear phosphite ester compound.

3. The polycarbonate resin composition of claim 1, comprising 10 to 300 parts by weight of the photoreactive compound containing a phenylene functional group, based on 100 parts by weight of the cyclic phosphite ester compound and the linear phosphite ester compound.

4. The polycarbonate resin composition of claim 1, wherein the cyclic phosphite ester compound includes two phosphite groups and a tetravalent organic functional group bonded to the two phosphite groups.

5. The polycarbonate resin composition of claim 1, wherein the cyclic phosphite ester compound is represented by the following chemical formula 1,

[Chemical Formula 1]

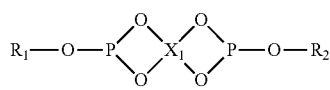

in the chemical formula 1,
$X_1$ is a tetravalent organic functional group, and $R_1$ and $R_2$ are the same or different from each other and are each independently an aryl group having 6 to 40 carbon atoms.

6. The polycarbonate resin composition of claim 5, wherein the $X_1$ is represented by the following chemical formula 1-1,

[Chemical Formula 1-1]

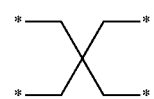

in the chemical formula 1-1, "*" is a point of a bonding position.

7. The polycarbonate resin composition of claim 1, wherein the linear phosphite ester compound includes a phosphite functional group and an aryl group having 6 to 40 carbon atoms bonded to the phosphite functional group.

8. The polycarbonate resin composition of claim 1, wherein the linear phosphite ester compound is represented by the following chemical formula 2,

[Chemical Formula 2]

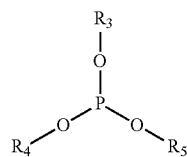

in the chemical formula 2, $R_3$, $R_4$ and $R_5$ are the same or different from each other and are each independently an aryl group having 6 to 40 carbon atoms.

9. The polycarbonate resin composition of claim 1, wherein the (meth)acrylate repeating unit containing the epoxy functional group includes a repeating unit represented by the following chemical formula 3:

[Chemical Formula 3]

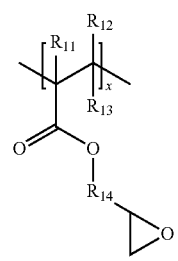

in the chemical formula 3, $R_{11}$, $R_{12}$ and $R_{13}$ are hydrogen or a linear or branched alkyl group having 1 to 10 carbon atoms, $R_{14}$ is a linear or branched alkylene group having 1 to 10 carbon atoms, and x is an integer of 1 to 20.

10. The polycarbonate resin composition of claim 1, wherein the vinyl-based polymer including a (meth)acrylate repeating unit containing an epoxy functional group includes an aromatic vinyl-based repeating unit represented by the following chemical formula 4 and a (meth)acrylic-based repeating unit represented by the following chemical formula 5:

[Chemical Formula 4]

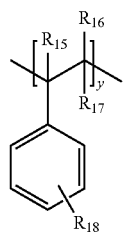

in the chemical formula 4,
R$_{15}$ to R$_{18}$ are each independently hydrogen or a linear or branched alkyl group having 1 to 10 carbon atoms, and y is an integer of 1 to 20,

[Chemical Formula 5]

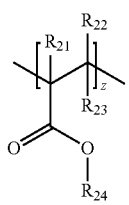

in the chemical formula 5,
R$_{21}$ to R$_{24}$ are each independently hydrogen or a linear or branched alkyl group having 1 to 10 carbon atoms, and z is an integer of 1 to 20.

11. The polycarbonate resin composition of claim 1, wherein the vinyl-based polymer including a (meth)acrylate repeating unit containing an epoxy functional group has a weight average molecular weight of 1,000 g/mol to 10,000 g/mol.

12. The polycarbonate resin composition of claim 1, wherein the vinyl-based polymer including a (meth)acrylate repeating unit containing an epoxy functional group has an epoxy equivalent weight of 100 g/mol to 500 g/mol.

13. The polycarbonate resin composition of claim 1, wherein the photoreactive compound containing a phenylene functional group includes an aromatic compound having 6 to 20 carbon atoms or an ester compound having 4 to 20 carbon atoms bonded to the phenylene functional group, together with the phenylene functional group.

14. The polycarbonate resin composition of claim 13, wherein the aromatic compound having 6 to 20 carbon atoms includes benzoxazinone, and the ester compound having 4 to 20 carbon atoms includes a methylene malonic acid ester.

15. The polycarbonate resin composition of claim 1, wherein the polycarbonate has a weight average molecular weight of 14,000 g/mol to 30,000 g/mol.

16. The polycarbonate resin composition of claim 1, wherein the polycarbonate includes a repeating unit represented by the following chemical formula 6:

[Chemical Formula 6]

$$\left[ \begin{array}{c} O-\phantom{}\hspace{-0.5em}\text{Ar}\hspace{-0.5em}\phantom{}-O-\overset{O}{\underset{\phantom{}}{C}}- \end{array} \right]_a$$

1) in the chemical formula 6, a is an integer of 1 or more.

17. The polycarbonate resin composition of claim 1, further comprising one or more additives selected from the group consisting of an antioxidant, a heat stabilizer, a plasticizer, an antistatic agent, a nucleating agent, a flame retardant, a lubricant, an impact modifier, a fluorescent whitening agent, an ultraviolet absorber and a radiation absorber.

18. An optical molded article comprising the polycarbonate resin composition of claim 1.

19. The optical molded article of claim 18 wherein the optical molded article is a light emitting diode or a lens.

* * * * *